United States Patent
Baba (10) Patent No.: US 8,344,776 B2
(45) Date of Patent: Jan. 1, 2013

(54) MEMORY INTERFACE CIRCUIT AND DRIVE CAPABILITY ADJUSTMENT METHOD FOR MEMORY DEVICE

(75) Inventor: Takahide Baba, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/474,154

(22) Filed: May 17, 2012

(65) Prior Publication Data

US 2012/0229186 A1 Sep. 13, 2012

Related U.S. Application Data

(63) Continuation of application No. PCT/JP2010/004502, filed on Jul. 12, 2010.

(30) Foreign Application Priority Data

Nov. 20, 2009 (JP) ................................. 2009-265702

(51) Int. Cl.
*G11C 7/00* (2006.01)
*G11C 8/18* (2006.01)
*H03L 7/00* (2006.01)

(52) U.S. Cl. ... 327/161; 327/153; 327/276; 365/189.07; 365/294; 365/233.1

(58) Field of Classification Search .................. 327/149, 327/153, 158, 161, 250, 252, 261, 262, 276, 327/277, 284; 365/189.05, 189.07, 193, 365/194, 233.1–233.5

See application file for complete search history.

(56) References Cited

U.S. PATENT DOCUMENTS

| | | | |
|---|---|---|---|
| 6,556,505 B1 * | 4/2003 | Tojima et al. | 365/233.11 |
| 6,911,851 B2 | 6/2005 | Sekiguchi et al. | |
| 7,164,287 B2 | 1/2007 | Ueno | |
| 7,518,946 B2 * | 4/2009 | Iwasaki | 365/233.1 |
| 7,755,402 B1 * | 7/2010 | Ku et al. | 327/153 |
| 7,839,159 B2 | 11/2010 | Nakamura et al. | |
| 2004/0189360 A1 | 9/2004 | Sekiguchi et al. | |

(Continued)

FOREIGN PATENT DOCUMENTS

JP 2004-074623 3/2004

(Continued)

OTHER PUBLICATIONS

International Search Report issued in International Patent Application No. PCT/JP2010/004502, mailed Oct. 5, 2010.

*Primary Examiner* — Patrick O'Neill
(74) *Attorney, Agent, or Firm* — McDermott Will & Emery LLP (57) ABSTRACT

Provided is a memory interface circuit connected to a memory device that outputs a first data signal, and including: a first delay unit delaying a first strobe signal outputted from the memory device by a first delay amount to generate a first delayed strobe signal; a first data latch unit latching the first data signal as a first latched data signal in synchronization with the first delayed strobe signal; a first range calculating unit calculating a first delay range width that is a width of a range of values of the first delay amount which allow the first data latch unit to correctly latch the first data signal as the first latched data signal; and a drive capability setting unit adjusting the drive capability of the memory device so as to widen the first delay range width.

11 Claims, 6 Drawing Sheets

U.S. PATENT DOCUMENTS

| | | |
|---|---|---|
| 2005/0110516 A1 | 5/2005 | Ueno |
| 2007/0148796 A1 | 6/2007 | Nakamura et al. |
| 2010/0205386 A1 | 8/2010 | Yamashita |
| 2011/0176372 A1 | 7/2011 | Baba et al. |

FOREIGN PATENT DOCUMENTS

| | | |
|---|---|---|
| JP | 2004-185608 | 7/2004 |
| JP | 2005-159702 | 6/2005 |
| JP | 2007-123987 | 5/2007 |
| JP | 2008-125555 | 6/2008 |
| JP | 2010-182149 | 8/2010 |
| WO | WO 2010/038422 A1 | 4/2010 |

* cited by examiner

MEMORY INTERFACE CIRCUIT AND DRIVE CAPABILITY ADJUSTMENT METHOD FOR MEMORY DEVICE

CROSS REFERENCE TO RELATED APPLICATION

This is a continuation application of PCT Patent Application No. PCT/JP2010/004502 filed on Jul. 12, 2010, designating the United States of America, which is based on and claims priority of Japanese Patent Application No. 2009-265702 filed on Nov. 20, 2009. The entire disclosures of the above-identified applications, including the specifications, drawings and claims are incorporated herein by reference in their entirety.

TECHNICAL FIELD

The present invention relates to a memory interface circuit and a drive capability adjustment method for a memory device, and in particular to a memory interface circuit connected to a memory device that outputs a first data signal and has a variable drive capability for driving the first data signal.

BACKGROUND ART

In order to cope with an increase in a processing amount, recent memory systems often use memory devices capable of inputting and outputting data in synchronization with clocks, such as a Synchronous Dynamic Random Access Memory (SDRAM). These memory devices input and output data (DQ) in synchronization with rising and falling edges of data strobe signals (DQS).

In particular, data valid periods for the strobe signals tend to be shorter along with increase in the operating frequency of the memory devices. Thus, stable input and output of data is becoming difficult, considering variations in a timing relationship between data and the strobe signals due to the process properties, changes in temperature and voltage, and impedance matching when memory devices are mounted. Under these circumstances, the recent memory systems generally include a function called the ZQ calibration for adjusting the drive capabilities of memory devices.

On the other hand, the memory system in PTL 1 includes a variable delay unit that adjusts a delay amount for a data signal or a strobe signal, using a variable delay element. Accordingly, the memory system in PTL 1 can stably input and output data by adjusting the timing relationship between data and the strobe signals to an appropriate access timing.

In addition, by adjusting the drive capabilities of memory devices, the variable delay element can cover a larger range of the delay amount in which the data can be stably input and output. For example, using the ZQ calibration function for adjusting the drive capability, the drive capability can be adjusted for each chip in consideration of the variations in the impedance matching when the memory devices are mounted. Accordingly, the memory system can more stably input and output data.

With the accelerated increase in the operating frequency of the memory devices in recent years, a period for defining data is becoming shorter. The need for adjusting the access timing with higher precision is growing.

Citation List
Patent Literature
[PTL 1] Japanese Unexamined Patent Application Publication No. 2004-074623

SUMMARY OF INVENTION

Technical Problem

Conventionally, it is necessary to adjust the delay amount as described in PTL 1 and adjust the drive capability as described above, after suspending the normal operation. Thus, when the access timing between data and strobe signals varies according to the changes in temperature and voltage, it is necessary to temporarily suspend the normal operation and restart the calibration operation.

Thus, the conventional memory system cannot absorb the variation in the access timing between the current calibration operation and the next calibration operation. Accordingly, in the conventional memory system, the access timing variation needs to fall within an operation margin as the variation in the access timing during the normal operation.

Once the operating frequency of a memory device is accelerated, as the period for defining data is prolonged, a period secured as an operating margin is shortened. Thus, the access timing variation during the normal operation hardly falls within the operation margin. In order to reduce the access timing variation, it is necessary to frequently calibrate each of a delay amount and the drive capability.

However, when such a calibration operation is frequently performed, there is a problem that during the calibration operation, the normal operation cannot be performed and the processing stops.

The present invention solves the conventional problems, and has an object of providing a memory interface circuit that can calibrate the drive capability during the normal operation.

Solution to Problem

In order to achieve the object, a memory interface circuit according to an aspect of the present invention is a memory interface circuit connected to a memory device that outputs a first data signal and has a variable drive capability for driving the first data signal, and including: a first delay unit configured to delay a first strobe signal outputted from the memory device by a first delay amount to generate a first delayed strobe signal; a first data latch unit configured to latch the first data signal as a first latched data signal in synchronization with the first delayed strobe signal; a second data latch unit configured to latch the first data signal as a second latched data signal; a first delay control unit configured to sequentially change a value of the first delay amount; a first range calculating unit configured to calculate a first delay range width that is a width of a range of values of the first delay amount which allow the first data latch unit to correctly latch the first data signal as the first latched data signal; and a drive capability setting unit configured to adjust the drive capability of the memory device so as to widen the first delay range width.

Advantageous Effects of Invention

The present invention provides a memory interface circuit that can calibrate a drive capability of a memory device during a normal operation.

BRIEF DESCRIPTION OF DRAWINGS

These and other objects, advantages and features of the invention will become apparent from the following description thereof taken in conjunction with the accompanying drawings that illustrate a specific embodiment of the present invention. In the Drawings.

DESCRIPTION OF EMBODIMENTS

Embodiments according to the present invention will be described with reference to drawings.

Embodiment 1

A memory interface circuit according to Embodiment 1 includes a monitoring latch circuit that is different from a latch circuit that outputs read data to the outside of the memory interface circuit. Furthermore, the memory interface circuit according to Embodiment 1 calculates a width of a range of values of a delay amount which allow the monitoring latch circuit to correctly latch the read data, and adjusts the drive capability of a memory device so as to widen the width.

Accordingly, the memory interface circuit according to Embodiment 1 can calibrate the drive capability during a normal operation.

First, a configuration of a memory interface circuit 114 according to Embodiment 1 will be described.

Figure 1:
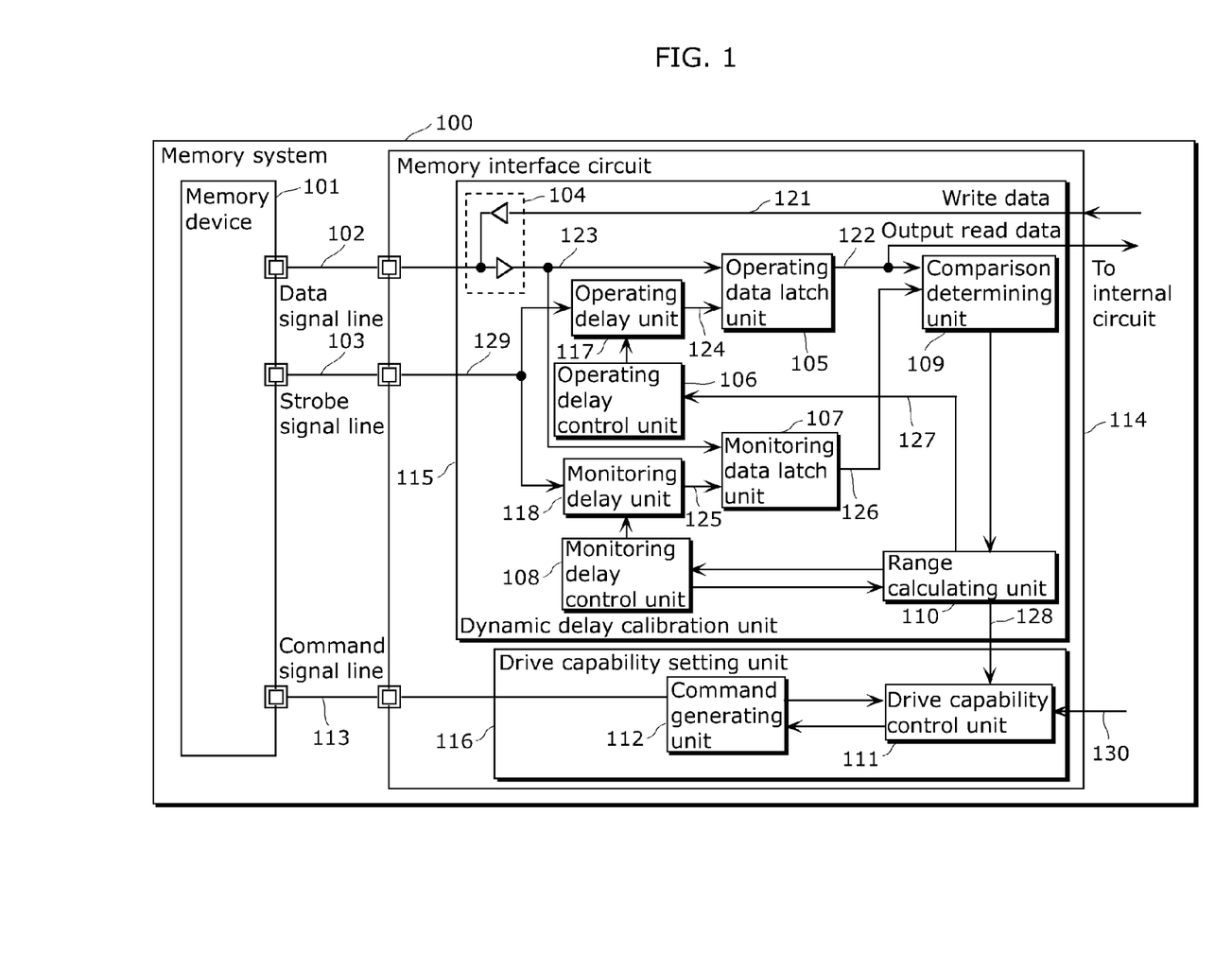
FIG. 1 is a block diagram illustrating a memory system according to Embodiment 1.

FIG. 1 is a functional block diagram illustrating an example of a configuration of a memory system 100 according to Embodiment 1.

The memory system 100 in FIG. 1 includes a memory device 101 and a memory interface circuit 114. The memory device 101 is connected to the memory interface circuit 114 through at least a data signal line 102, a strobe signal line 103, and a command signal line 113.

The memory device 101 may be a Single Data Rate (SDR)-SDRAM that latches data at one of rising and falling edges of a strobe signal, or a Double Data Rate (DDR)-SDRAM that latches data at both of the rising and falling edges of a strobe signal.

The configuration and operations related to the rising and falling edges of the strobe signal will be hereinafter briefly described to the point.

The memory device 101 outputs read data 123 and a strobe signal 129. Furthermore, the drive capability of the memory device 101 for driving the read data 123 can be externally changed.

The memory interface circuit 114 writes write data 121 to the memory device 101. Furthermore, the memory interface circuit 114 reads the read data 123 from the memory device 101, and outputs the read data 123 as output read data 122 to the outside of the memory interface circuit 114. Furthermore, the memory interface circuit 114 has a function for adjusting, during the normal operation, the timing between the read data 123 and the strobe signal 129 by adjusting a delay amount that delays the strobe signal 129. Furthermore, the memory interface circuit 114 has a function for adjusting the drive capability of the memory device 101 during the normal operation.

The data signal line 102 is used for transferring the write data 121 written from the memory interface circuit 114 to the memory device 101, and the read data 123 read from the memory device 101. The data signal line 102 is generally a bidirectional signal line. In FIG. 1, although the data signal line 102 is composed of a single line, it may be composed of a plurality of data signal lines corresponding to the strobe signal line 103.

When the memory interface circuit 114 writes the write data 121 to the memory device 101, the strobe signal line 103 is used for outputting a write strobe signal from the memory interface circuit 114 to the memory device 101. Conversely, when the memory interface circuit 114 reads the read data 123 from the memory device 101, the strobe signal line 103 is used for outputting the strobe signal 129 for read operations from the memory device 101 to the memory interface circuit 114. The strobe signal line 103 is also generally a bidirectional signal line. FIG. 1 omits the illustration of a circuit that generates a write strobe signal. Furthermore, the strobe signal 129 for read operations will be also simply referred to as the strobe signal 129.

The command signal line 113 is generally composed of a plurality of signal lines, and is used for setting an operating condition including a drive capability to the memory device 101. As long as the command signal line 113 is used for setting an operating condition under a predetermined condition, it may be used as another signal line for transferring an address signal to the memory device 101.

The memory interface circuit 114 includes a dynamic delay calibration unit 115 and a drive capability setting unit 116. Furthermore, the dynamic delay calibration unit 115 includes a direction control unit 104, an operating data latch unit 105, an operating delay control unit 106, a monitoring data latch unit 107, a monitoring delay control unit 108, a comparison determining unit 109, an operating delay unit 117, a monitoring delay unit 118, and a range calculating unit 110. The drive capability setting unit 116 includes a drive capability control unit 111 and a command generating unit 112.

When a DDR-SDRAM is used as the memory device 101, two memory interface circuits 114 each with the aforementioned constituent elements may be provided for the single strobe signal line 103 so as to correspond to the rising and falling edges of the strobe signal 129. Thus, the timings of the rising and falling edges of the strobe signal 129 can be separately adjusted.

The direction control unit 104 controls whether the write data 121 is transferred from an internal circuit to the data signal line 102 or the read data 123 is transferred from the data signal line 102 to the operating data latch unit 105 and the monitoring data latch unit 107.

The internal circuit is a circuit that uses the memory device 101 through the memory interface circuit 114. The present invention does not limit the functions of the internal circuit. The internal circuit is, for example, a Central Processing Unit (CPU).

The operating delay unit 117 delays the strobe signal 129 that the memory device 101 outputs to the strobe signal line 103, by an operating delay amount to generate an operating strobe signal 124.

The monitoring delay unit 118 delays the strobe signal 129 that the memory device 101 outputs to the strobe signal line 103, by a monitoring delay amount to generate a monitoring strobe signal 125.

The operating data latch unit 105 latches the read data 123 transmitted from the direction control unit 104 in synchronization with the operating strobe signal 124 (the rising edge). Furthermore, the operating data latch unit 105 outputs the latched read data 123 as the output read data 122 to the internal circuit, and outputs the output read data 122 to the comparison determining unit 109.

The monitoring data latch unit 107 latches the read data 123 transmitted from the direction control unit 104 in synchronization with the monitoring strobe signal 125 (the rising edge). Furthermore, the monitoring data latch unit 107 outputs the latched read data 123 as monitoring data 126 to the comparison determining unit 109.

The monitoring delay control unit 108 sets a monitoring delay amount used by the monitoring data latch unit 107.

The comparison determining unit 109 compares, for example, a value of the output read data 122 latched by the operating data latch unit 105 with a value of the monitoring data 126 latched by the monitoring data latch unit 107 for each read operation. For example, the comparison determining unit 109 determines whether or not the value of the output read data 122 matches the value of the monitoring data 126.

When the data signal line 102 is composed of a plurality of data signal lines, each of the operating data latch unit 105 and the monitoring data latch unit 107 is composed of bits. Furthermore, the comparison determining unit 109 compares data of the bits.

The range calculating unit 110 calculates, using a result of the comparison by the comparison determining unit 109, a range of values of a monitoring delay amount (hereinafter referred to as a delay range 127) which allow the monitoring data latch unit 107 to correctly latch the read data 123 as the monitoring data 126. In other words, the delay range 127 is a range of values of an operation delay amount which allow the operating data latch unit 105 to correctly latch the read data 123 as the output data 122.

Figure 2:
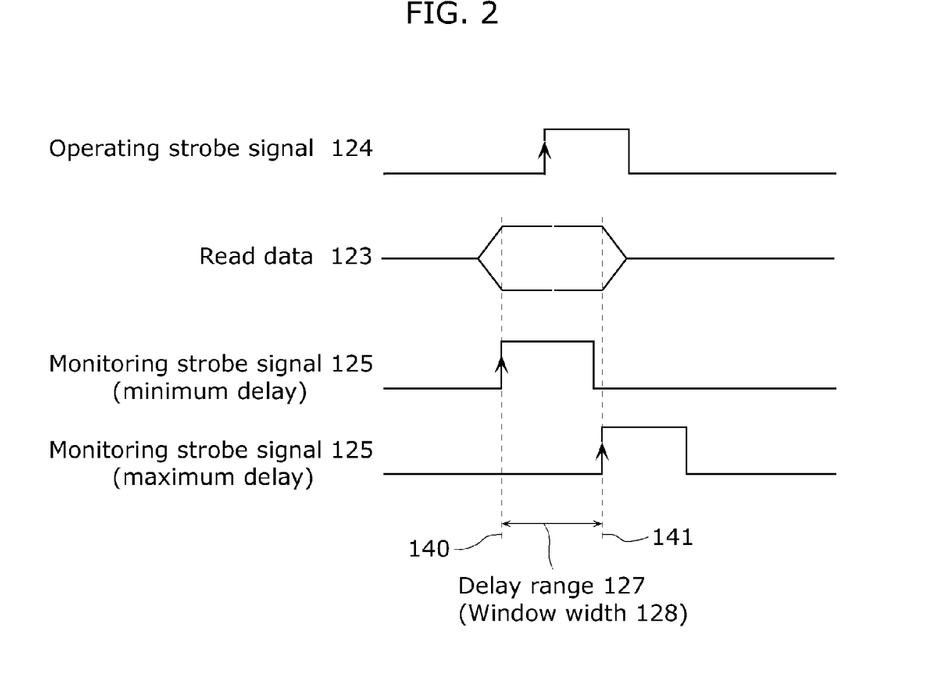
FIG. 2 illustrates a delay range according to Embodiment 1.

FIG. 2 illustrates the delay range 127. As illustrated in FIG. 2, the delay range 127 is a range of a delay amount between a boundary 140 with a delay value smaller than which data cannot be correctly latched and a boundary 141 with a delay value larger than which data cannot be correctly latched.

More specifically, the monitoring delay control unit 108 sequentially changes a value of a monitoring delay amount for each read access. The comparison determining unit 109 determines whether or not the monitoring data 126 matches the output read data 122 for each value of the monitoring delay amount changed by the monitoring delay control unit 108. The range calculating unit 110 stores a result of the determination by the comparison determining unit 109 for each of the values of the monitoring delay amount. Furthermore, the range calculating unit 110 calculates a range of the values, of the monitoring delay amount, with each of which the monitoring data 126 matches the output read data 122, as the delay range 127.

The range calculating unit 110 may calculate a range obtained by adding a predetermined margin to the range of the values, of the monitoring delay amount, with each of which the monitoring data 126 matches the output read data 122, as the delay range 127. For example, the delay range 127 may be a range obtained by narrowing the range of the values, of the monitoring delay amount, with each of which the monitoring data 126 matches the output read data 122, by a predetermined value.

The operating delay control unit 106 sets the operating delay amount used by the operating delay unit 117, within the delay range 127 calculated by the range calculating unit 110. More specifically, the operating delay control unit 106 calculates the operating delay amount using the delay range 127. For example, the operating delay control unit 106 calculates, as the operating delay amount, a delay amount obtained by adding a predetermined margin to one of the boundaries of the delay range 127.

With the series of the operations by the dynamic delay calibration unit 115 including performing a continued normal operation by latching the output read data 122 using the operating data latch unit 105, and an operation in which the monitoring data latch unit 107 latches the monitoring data 126, the memory system 100 can monitor the boundaries of the delay amount with which the read data 123 can be appropriately latched. Accordingly, the dynamic delay calibration unit 115 can calibrate the delay amount without suspending the normal operation.

Furthermore, the internal circuit uses the output read data 122 latched by the operating data latch unit 105, and does not use the monitoring data 126 latched by the monitoring data latch unit 107. Since a delay value around the boundaries of the delay range 127 is set to the monitoring data latch unit 107, even when the monitoring data latch unit 107 latches wrong data, it will not influence the operations of the internal circuit.

Although the range calculating unit 110 calculates a range of a delay amount in which the read data 123 can be correctly latched, the range calculating unit 110 may calculate only one of the boundary 140 with a delay value smaller than which data cannot be correctly latched and the boundary 141 with a delay value larger than which data cannot be correctly latched. Here, the operating delay control unit 106 has only to calculate, as the operating delay amount, a delay amount obtained by adding a predetermined margin to one of the boundaries calculated by the range calculating unit 110.

Furthermore, when the delay range 127 is calculated, the dynamic delay calibration unit 115 may include two sets of the monitoring data latch unit 107, the monitoring delay control unit 108, and the monitoring delay unit 118 so as to separately monitor a boundary with the smaller delay value and a boundary with the larger delay value.

In addition to these operations, the range calculating unit 110 calculates a window width 128 indicating a width of the calculated delay range 127.

The drive capability setting unit 116 adjusts the drive capability of the memory device 101 so that the window width 128 widens.

More specifically, the drive capability setting unit 116 sequentially changes the drive capability of the memory device 101. Furthermore, the drive capability setting unit 116 stores the window width 128 calculated by the range calculating unit 110, for each changed drive capability. Furthermore, the drive capability setting unit 116 adjusts the drive capability of the memory device 101 to the drive capability corresponding to the largest window width among the stored window widths 128.

The drive capability control unit 111 stores one-to-one correspondences between the window width 128 calculated by the range calculating unit 110 and the drive capability set to the memory device 101. Furthermore, the drive capability control unit 111 transmits a setting value of the drive capability to be updated, to the command generating unit 112.

The command generating unit 112 issues a drive capability setting command to the memory device 101 through the command signal line 113, based on the drive capability setting value transmitted from the drive capability control unit 111.

The read data 123, the strobe signal 129, and the window width 128 correspond to a first data signal, a first strobe signal, and a first delay range width, respectively. Furthermore, the monitoring delay unit 118, the monitoring delay amount, the monitoring strobe signal 125, the monitoring data latch unit 107, the monitoring data 126, and the monitoring delay control unit 108 correspond to a first delay unit, a first delay amount, a first delayed strobe signal, a first data latch unit, first latched data, and a first delay control unit, respectively. Furthermore, the operating delay unit 117, the operating delay amount, the operating strobe signal 124, the operating data latch unit 105, the output read data 122, and the operating delay control unit 106 correspond to a second delay unit, a second delay amount, a second delayed strobe signal, a second data latch unit, second latched data, and a second delay control unit, respectively.

Hereinafter, operations for adjusting the drive capability by the memory system 100 according to Embodiment 1 will be described.

Figure 3:
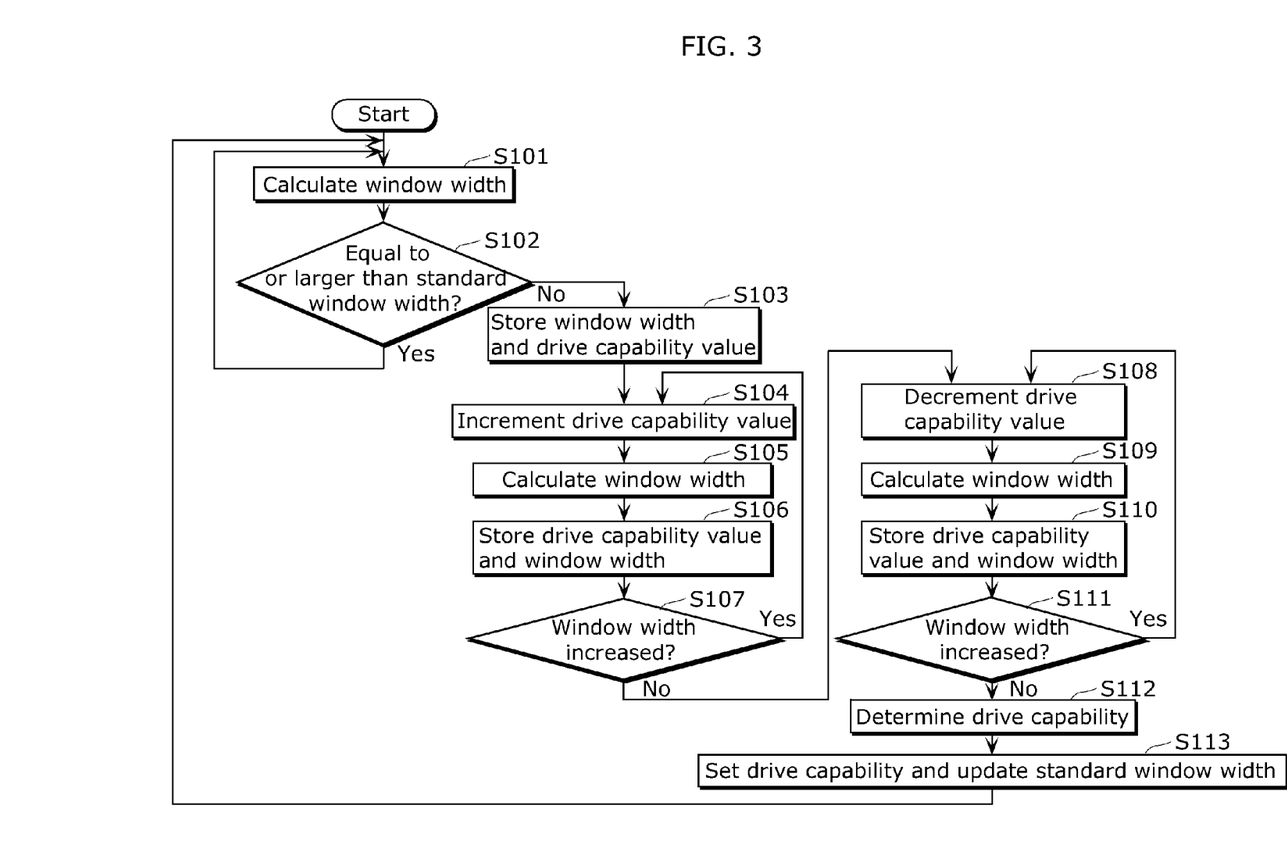
FIG. 3 is a flowchart of processes for adjusting a drive capability according to Embodiment 1.

FIG. 3 is a flowchart of the operations for adjusting the drive capability by the memory system 100.

First, the range calculating unit 110 calculates the window width 128 (S101).

Next, the drive capability control unit 111 determines whether the window width 128 calculated by the range calculating unit 110 is equal to or larger than a standard window width 130 (S102). Here, the standard window width 130 indicates the window width 128 for which the drive capability needs to be readjusted because the memory system 100 cannot stably perform access for use when the window width 128 is narrower than the standard window width 130. The standard window width 130 may be externally input as a conditional input, generated by a processing unit included in the memory interface circuit 114, or stored in a storage unit included in the memory interface circuit 114. For example, the standard window width 130 is a value of a register set by software.

Furthermore, the processes of Steps S101 and S102 may be repeated each time the range calculating unit 110 calculates the window width 128, until the drive capability control unit 111 determines that the window width 128 is smaller than the standard window width 130 (No at S102).

When determining that the window width 128 is smaller than the standard window width 130 (No at S102), the drive capability control unit 111 stores the current window width 128 and a current drive capability value (S103).

Figure 4:
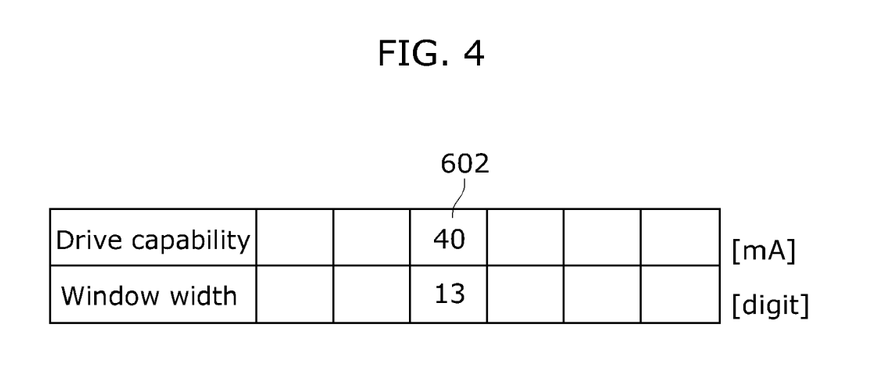
FIG. 4 illustrates a correspondence between a drive capability and a window width according to Embodiment 1.

FIG. 4 illustrates an example of a one-to-one correspondence between the window width 128 and the drive capability value that are stored in the drive capability control unit 111. Here, a drive capability value 602 is stored as 40 mA, and the window width 128 at that time is stored as 13 digits. Here, mA that is a driving current value is used as a unit of the drive capability value, and digit that is a management unit of a monitoring delay amount by the monitoring delay unit 118 is used as a unit of the window width 128. These management units are not important, and they may be managed in any of units.

Processes after Step S104 are operations for calibrating the drive capability.

First, the drive capability control unit 111 changes setting in a direction to increment the drive capability value by 1 (S104). Accordingly, the command generating unit 112 increments the drive capability value of the memory device 101 by 1. Here, the drive capability value is incremented by 1 as an example. This means incrementing the driving current value by 1 mA when the driving current value is used as the drive capability value. However, this is only an example, and the extent of increment in the driving current value that corresponds to the increment of the drive capability value by 1 may be a predetermined value. In other words, the drive capability control unit 111 may increment the drive capability value by n, where n is any natural number. Furthermore, the value corresponding to the drive capability value is not limited to the driving current value.

According to the operation at Step S104, the drive capability of the memory device 101 to the data signal line 102 is changed, and a range (window) of the delay values with allow the read data 123 to be latched by the monitoring strobe signal 125 is also changed. Next, the range calculating unit 110 calculates the window width 128 after changing the drive capability (S105).

Here, the monitoring data latch unit 107 detects the change in the window width 128 in both cases where the window width 128 is narrowed and widened. Thus, as long as the change in the drive capability value is sufficiently small, the operating data latch unit 105 will not latch wrong data, and the normal operations of the memory system 100 can be continued.

Next, the drive capability control unit 111 stores a new drive capability value obtained at Step S104 and the new window width 128 calculated at Step S105 (S106).

Next, the drive capability control unit 111 determines whether or not the window width 128 has increased by comparing the new window width 128 stored at Step S106 with the window width 128 previously stored (S107). When the window width 128 has increased (Yes at S107), the processes from Step S104 are again performed. The criteria for determining whether or not the window width 128 has increased vary. When the window width 128 is maintained the same, has slightly decreased, or has slightly increased, the drive capability control unit 111 may determine that the window width 128 has increased.

In other words, the drive capability control unit 111 subtracts the window width 128 previously stored from the new window width 128 stored at Step S106. The drive capability control unit 111 determines that the window width 128 has increased when a difference value as a result of the subtraction is equal to or larger than a predetermined threshold, whereas the drive capability control unit 111 determines that the window width 128 has decreased when the difference value is smaller than the predetermined threshold.

Figure 5:
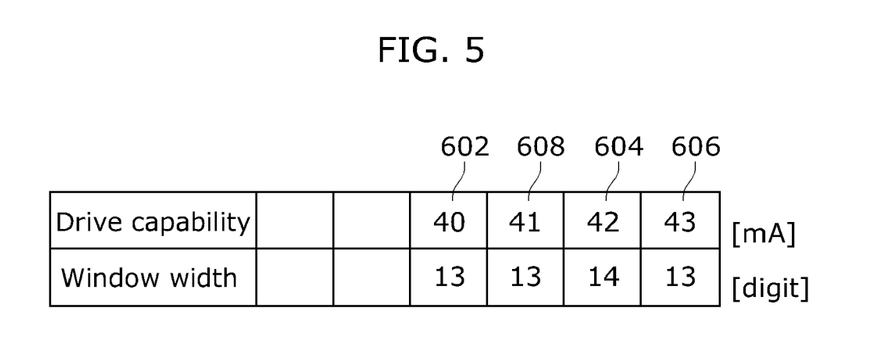
FIG. 5 illustrates one-to-one correspondences between the drive capability and the window width according to Embodiment 1.

FIG. 5 illustrates an example of one-to-one correspondences between the drive capability value stored in the drive capability control unit 111 and the window width 128 in a state where the processes from Step S104 to S107 are repeated several times.

As a result of the loop operation starting from a drive capability value 602, the window width 128 increases each time the drive capability value is increased, up to a drive capability value 604. However, the window width 128 has decreased when the drive capability is increased to a drive capability value 606.

As such when the window width 128 has decreased (No at S107), next, the drive capability control unit 111 changes the setting in a direction to decrement the drive capability value by 1 (S108). As a result, the window width 128 is changed.

Next, the range calculating unit 110 calculates the window width 128 after changing the drive capability (S109).

Next, the drive capability control unit 111 stores a new drive capability value obtained at Step S108 and the new window width 128 calculated at Step S109 (S110).

Next, the drive capability control unit 111 determines whether or not the window width 128 has increased by comparing the new window width 128 stored at Step S110 with the window width 128 previously stored (S111). When the window width 128 has increased (Yes at S111), the processes from Step S108 are again performed. The criteria for determining whether or not the window width 128 has increased vary. When the window width 128 is maintained the same, has slightly decreased, or has slightly increased, the drive capability control unit 111 may determine that the window width 128 has increased.

In other words, the drive capability control unit 111 subtracts the window width 128 previously stored from the new window width 128 stored at Step S110. The drive capability control unit 111 determines that the window width 128 has increased when a difference value as a result of the subtraction is equal to or larger than a predetermined threshold, whereas the drive capability control unit 111 determines that the window width 128 has decreased when the difference value is smaller than the predetermined threshold.

In the example illustrated in FIG. 5, after repetition of the processes from Step S108 to S111 in a direction to decrease the drive capability value 606, the window width 128 is narrowed at the time when the drive capability value 604 is updated to the drive capability value 608.

As such, when the window width 128 has decreased (No at S111), next, the drive capability control unit 111 determines the drive capability value with which the window width 128 is the largest, from among the drive capability values and the window widths 128 that are stored, as a drive capability value to be set (S112). In the example illustrated in FIG. 5, since the window width 128 for the drive capability value 604 is the largest, the drive capability value 604 is determined as the drive capability value to be set.

Next, the command generating unit 112 generates a command for setting the optimal drive capability value determined at Step S112 to set the drive capability value of the memory device 101 (S113).

As described above, the operations for calibrating the drive capability are completed. Furthermore, the drive capability setting unit 116 updates the standard window width 130 to be used at Step S101, according to the newly set drive capability. For example, the drive capability setting unit 116 sets the window width 128 corresponding to the newly set drive capability or a value obtained by adding or subtracting a predetermined value to or from the window width 128, as the new standard window width 130.

Although the processes for decreasing the drive capability value (Steps S108 to S111) are performed after the processes for increasing the drive capability value (Steps S104 to S107) as an example in Embodiment 1, the processes for increasing the drive capability value may be performed after the processes for decreasing the drive capability value.

Furthermore, although Embodiment 1 describes the example when the drive capability value stored at Step S103 is larger than the drive capability value determined at Step S112, the optimal drive capability value can be searched even when the drive capability value stored at Step S103 is smaller than the drive capability value determined at Step S112.

Figure 6:
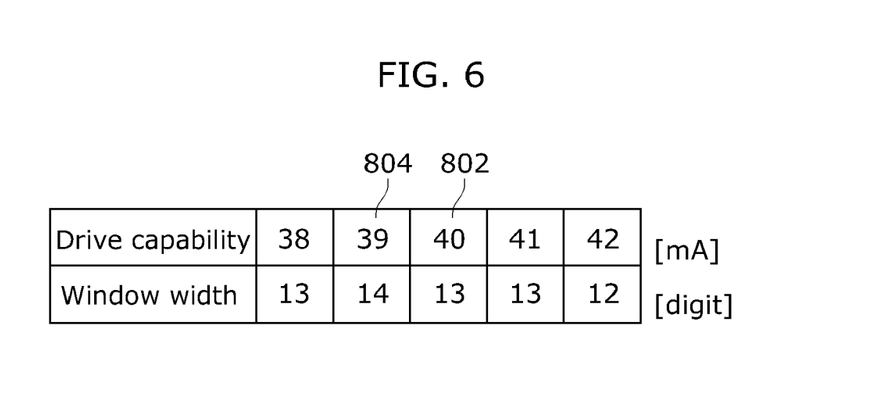
FIG. 6 illustrates one-to-one correspondences between the drive capability and the window width according to Embodiment 1.

FIG. 6 illustrates an example of one-to-one correspondences between the window width 128 and the drive capability value that are stored in the drive capability control unit 111.

For example, as illustrated in FIG. 6, since the number of loop operations from Step S108 to Step S111 is larger than the number of loop operations from Step S104 to Step S107 when a drive capability value 802 is stored at Step S103, the window width 128 corresponding to a drive capability value 804 is determined as the optimal value at Step S112.

As described above, the memory interface circuit 114 according to Embodiment 1 includes monitoring circuits (the monitoring delay unit 118 and the monitoring data latch unit 107) separate from circuits for normal operations (the operating delay unit 117 and the operating data latch unit 105). Furthermore, the memory interface circuit 114 calculates the delay range 127 in which the read data 123 can be correctly latched by changing a delay amount in the monitoring circuits. Furthermore, the memory interface circuit 114 adjusts the delay amount of the operating delay unit 117 using the calculated delay range 127.

Accordingly, the memory interface circuit 114 can calibrate the delay amount using the monitoring circuits that do not influence the normal operations. Thus, the memory interface circuit 114 can calibrate the delay amount during the normal operations without suspending the normal operations.

Furthermore, the memory interface circuit according to Embodiment 1 calculates the window width 128 using the delay range 127 calculated using the monitoring circuits. Furthermore, the memory interface circuit 114 adjusts the drive capability of the memory device 101 so as to widen the calculated window width 128.

Accordingly, the memory interface circuit 114 can calibrate the drive capability of the memory device 101 using the monitoring circuits that do not influence the normal operations. Thus, the memory interface circuit 114 can adjust the setting of the drive capability of the memory device 101 even during the normal operations.

Embodiment 2

Embodiment 2 describes a memory interface circuit that corresponds to a plurality of data signal lines.

Here, when a memory system includes a plurality of data signal lines, the precision for adjusting delay is lowered by the variations between data signals with the configuration in Embodiment 1. In contrast, the memory interface circuit according to Embodiment 2 can improve the precision for adjusting delay by adjusting a delay amount for each of the data signals.

Figure 7:
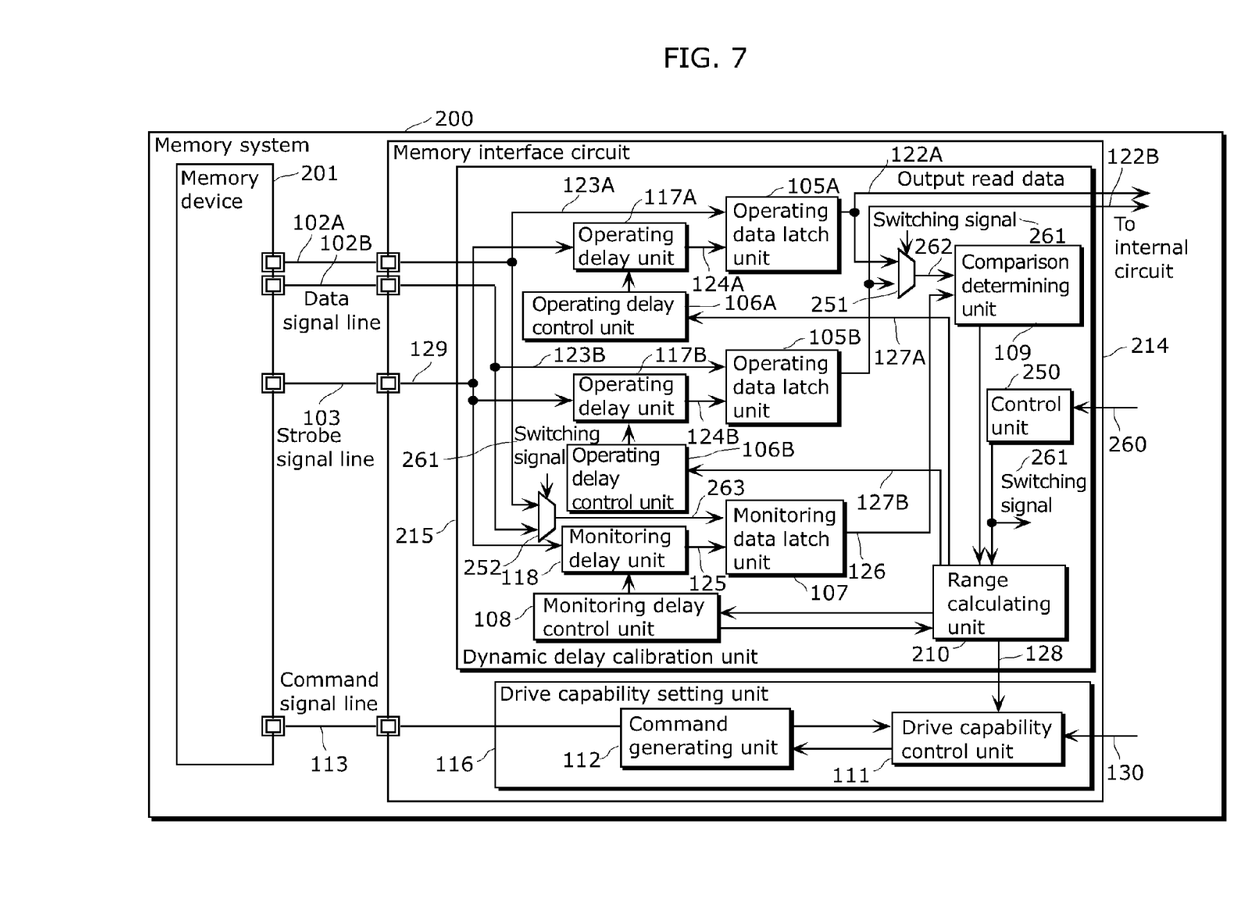
FIG. 7 is a block diagram illustrating a memory system according to Embodiment 2.

FIG. 7 is a block diagram illustrating a memory system 200 according to Embodiment 2. The same reference numerals are used for the same constituent elements as in FIG. 1. Furthermore, the following mainly describes the differences with the memory system 100 according to Embodiment 1, and the overlapping description with Embodiment 1 will be omitted.

The memory system 200 according to Embodiment 2 includes a memory device 201 and a memory interface circuit 214. Here, the memory system 200 differs from the memory system 100 according to Embodiment 1 in that the memory device 201 and the memory interface circuit 214 are connected through two data signal lines 102A and 102B.

Furthermore, the configuration of a dynamic delay calibration unit 215 in the memory interface circuit 214 also differs from that of the dynamic delay calibration unit 115 according to Embodiment 1. More specifically, the dynamic delay calibration unit 215 includes operating data latch units 105A and 105B, operating delay units 117A and 117B, and operating delay control units 106A and 106B, instead of the operating data latch unit 105, the operating delay unit 117, and the operating delay control unit 106 in FIG. 1. Furthermore, the dynamic delay calibration unit 215 further includes a control unit 250, and selecting units 251 and 252. Furthermore, functions of the range calculating unit 210 differ from those of the range calculating unit 110.

Although the direction control unit 104 and the write data 121 in FIG. 1 are omitted in FIG. 7, FIG. 7 includes these elements.

The operating delay unit 117A delays the strobe signal 129 by a first operating delay amount to generate an operating strobe signal 124A.

The operating delay unit 117B delays the strobe signal 129 by a second operating delay amount to generate an operating strobe signal 124B.

The operating data latch unit 105A latches read data 123A in synchronization with the operating strobe signal 124A (at the rising edge). Furthermore, the operating data latch unit 105A outputs the latched read data 123A as output read data 122A to the internal circuit.

The operating data latch unit 105B latches read data 123B in synchronization with the operating strobe signal 124B (at the rising edge). Furthermore, the operating data latch unit 105B outputs the latched read data 123B as output read data 122B to the internal circuit.

The control unit 250 generates a switching signal 261 according to a control signal 260. The control signal 260 is given as a conditional input. For example, the control signal 260 may be externally input, or generated by a processing unit included in the memory interface circuit 214. For example, the control signal 260 is a signal indicating whether or not an operation is a refresh operation. Here, the control unit 250 inverts a logical value of the switching signal 261 for each refresh operation. Furthermore, the switching signal 261 is a signal for selecting one of the read data 123A (the output read data 122A) and the read data 123B (the output read data 122B).

The selecting unit 252 selects one of the read data 123A and the read data 123B according to the logical value of the switching signal 261, and outputs the selected data as selected read data 263, to the monitoring data latch unit 107.

The monitoring data latch unit 107 latches the selected read data 263 output by the selecting unit 252, in synchronization with the monitoring strobe signal 125 (at the rising edge). Furthermore, the monitoring data latch unit 107 outputs the latched read data 123 as monitoring data 126 to the comparison determining unit 109.

The selecting unit 251 selects one of the output read data 122A and the output read data 122B according to the logical value of the switching signal 261, and outputs the selected data as selected read data 262, to the comparison determining unit 109. Furthermore, when the selecting unit 252 selects the read data 123A, the selecting unit 251 selects the output read data 122A. On the other hand, when the selecting unit 252 selects the read data 123B, the selecting unit 251 selects the output read data 122B.

The comparison determining unit 109 compares a value of the selected output read data 262 output by the selecting unit 251, with a value of the monitoring data 126. For example, the comparison determining unit 109 determines whether or not the value of the selected output read data 262 matches the value of the monitoring data 126.

The range calculating unit 210 calculates a delay range 127A or 128B using a result of the determination by the comparison determining unit 109, according to the logical value of the switching signal 261. More specifically, the range calculating unit 210 calculates the delay range 127A using a result of the determination by the comparison determining unit 109, when the switching signal 261 indicates selecting the read data 123A (the output read data 122A). Furthermore, the range calculating unit 210 calculates the delay range 127B using a result of the determination by the comparison determining unit 109, when the switching signal 261 indicates selecting the read data 123B (the output read data 122B). The details of a method of calculating the delay ranges 127A and 128B by the range calculating unit 210 are the same as those of a method of calculating the delay range 127 by the range calculating unit 110 according to Embodiment 1.

The operating delay control unit 106A sets the first operating delay amount to be used by the operating delay unit 117A, within the delay range 127A calculated by the range calculating unit 210.

The operating delay control unit 106B sets the second operating delay amount to be used by the operating delay unit 117B, within the delay range 127B calculated by the range calculating unit 210.

The detailed operations of the operating delay control units 106A and 106B are the same as those of the operating delay control unit 106 according to Embodiment 1.

Furthermore, the read data 123A and the read data 123B correspond to the first data signal and the second data signal, respectively. Furthermore, the delay range 127A and the delay range 127B correspond to the first delay range and the second delay range, respectively. Furthermore, the operating delay unit 117A and the operating delay unit 117B correspond to the second delay unit and the third delay unit, respectively. Furthermore, the first operating delay amount and the second operating delay amount correspond to the second delay amount and the third delay amount, respectively. Furthermore, the operating strobe signal 124A and the operating strobe signal 124B correspond to the second delayed strobe signal and the third delayed strobe signal, respectively. Furthermore, the operating data latch unit 105A and the operating data latch unit 105B correspond to the second data latch unit and the third data latch unit, respectively. Furthermore, the output read data 122A and the output read data 122B correspond to a second latched data signal and a third latched data signal, respectively. Furthermore, the monitoring data 126 corresponds to a first latched data signal and a fourth latched data signal. Furthermore, the operating delay control unit 106A and the operating delay control unit 106B correspond to the second delay control unit and the third delay control unit, respectively. Furthermore, the selecting unit 252 and the selecting unit 251 correspond to a first selecting unit and a second selecting unit, respectively. Furthermore, the selected read data 263 and the selected output read data 262 correspond to a selected data signal and a selected latched data signal, respectively.

As described above, the memory interface circuit 214 according to Embodiment 2 can improve the precision for adjusting delay by adjusting a delay amount for each of the read data 123A and the read data 123B.

Furthermore, the memory interface circuit 214 according to Embodiment 2 can share the monitoring delay unit 118, the monitoring data latch unit 107, the monitoring delay control unit 108, the comparison determining unit 109, and the range calculating unit 210 for a plurality of observation targets, by switching, by the selecting units 251 and 252, between the read data 123A and the read data 123B for each of which a delay value is observed. Accordingly, the memory interface circuit 214 can reduce the footprint in a semiconductor integrated circuit device, with the structure of switching between the observation targets.

Although Embodiment 2 describes the example using the two data signal lines 102A and 102B, the present invention is applicable to a case where a memory system includes three or more data signal lines.

Embodiment 3

Figure 8:
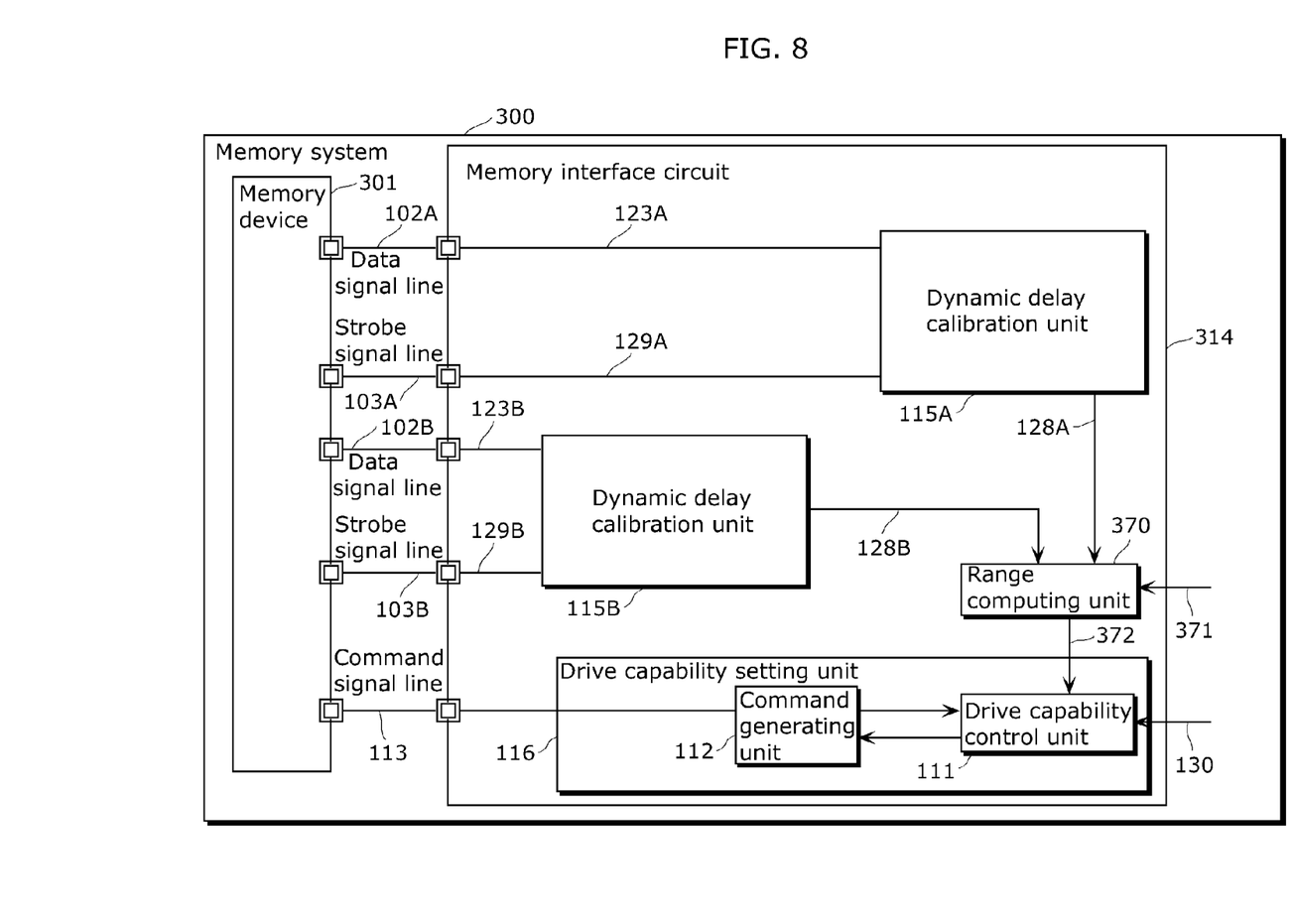
FIG. 8 is a block diagram illustrating a memory system according to Embodiment 3.

FIG. 8 is a block diagram illustrating a memory system 300 according to Embodiment 3. The same reference numerals are used for the same constituent elements as in FIG. 1. Furthermore, the following mainly describes the differences with the memory system 100 according to Embodiment 1, and the overlapping description with Embodiment 1 will be omitted.

The memory system 300 according to Embodiment 3 includes a memory device 301 and a memory interface circuit 314. Here, the memory system 300 differs from the memory system 100 according to Embodiment 1 in that the memory device 301 is connected to the memory interface circuit 314 through two data signal lines 102A and 102B and two strobe signal lines 103A and 103B.

The memory interface circuit 314 includes dynamic delay calibration units 115A and 115B, the drive capability setting unit 116, and a range computing unit 370.

Each of the dynamic delay calibration units 115A and 115B is a processing unit identical to the dynamic delay calibration unit 115 in FIG. 1.

The dynamic delay calibration unit 115A receives the read data 123A output from the memory device 301 through the data signal line 102A, and a strobe signal 129A output from the memory device 301 through the strobe signal line 103A. Furthermore, the dynamic delay calibration unit 115B receives the read data 123B output from the memory device 301 through the data signal line 102B, and a strobe signal 129B output from the memory device 301 through the strobe signal line 103B. Here, each of the read data 123A and the read data 123B corresponds to the read data 123 in FIG. 1. Furthermore, each of the strobe signals 129A and 129B corresponds to the strobe signal 129 in FIG. 1.

Furthermore, the dynamic delay calibration unit 115A generates a window width 128A, and the dynamic delay calibration unit 115B generates a window width 128B. Each of the window widths 128A and 128B corresponds to the window width 128 in FIG. 1.

The range computing unit 370 generates a window width 372 based on the window widths 128A and 128B. For example, the range computing unit 370 generates the window width 372 that is an intermediate value between values of the window widths 128A and 128B. More specifically, the range computing unit 370 computes an average of the window widths 128A and 128B, and outputs the calculated average as the window width 372. Here, the range computing unit 370 may select smaller or larger one of the window widths 128A and 128B, and output the selected one of the window widths 128A and 128B as the window width 372.

Furthermore, the range computing unit 370 may selectively carry out one of these operations according to a control signal 371.

The drive capability setting unit 116 performs the same processing as in Embodiment 1, using the window width 372 generated by the range computing unit 370 instead of the window width 128 in FIG. 1.

The read data 123A and the read data 123B correspond to the first data signal and the second data signal, respectively. Furthermore, the read strobe signal 129A and the read strobe signal 129B correspond to the first strobe signal and the second strobe signal, respectively. Furthermore, the window width 128A, the window width 128B, and the window width 372 correspond to the first delay range width, the second delay range width, and the third delay range width, respectively. Furthermore, the monitoring delay unit 118, the monitoring data latch unit 107, the operating data latch unit 105, the monitoring delay control unit 108, and the range calculating unit 110 that are included in the dynamic delay calibration unit 115A correspond to the first delay unit, the first data latch unit, the second data latch unit, the first delay control unit, and the first range calculating unit, respectively. Furthermore, the monitoring delay unit 118, the monitoring data latch unit 107, the operating data latch unit 105, the monitoring delay control unit 108, and the range calculating unit 110 that are included in the dynamic delay calibration unit 115B correspond to the fourth delay unit, the fourth data latch unit, the fifth data latch unit, the fourth delay control unit, and the second range calculating unit, respectively.

As described above, the memory interface circuit 314 according to Embodiment 3 includes the dynamic delay calibration units 115A and 115B, and the range computing unit 370 that computes the window widths 128A and 128B generated by the dynamic delay calibration units 115A and 115B. Accordingly, the memory interface circuit 314 can simultaneously generate the window width 128A and the window width 128B corresponding to the read data 123A and the read data 123B and to the strobe signal 129A and the strobe signal 129B, respectively.

Here, a semiconductor integrated circuit device can obtain, with time division, a window width for each of the read data 123A and the read data 123B, and the strobe signals 129A and 129B, using the memory interface circuit 114 according to Embodiment 1. Here, it is not possible to distinguish the variations in delay value with time, from the variations in delay value between data signals.

On the other hand, since the memory interface circuit 314 according to Embodiment 3 can simultaneously obtain the window widths 128A and 128B, it can calculate only the variations in delay value between data signals. Accordingly, the memory interface circuit 314 can set the optimal drive capability to a plurality of data signals with higher precision.

Each of the dynamic delay calibration units 115A and 115B may be replaced with the dynamic delay calibration unit 215 according to Embodiment 2.

Furthermore, each of the processing units included in the memory interface circuits 114, 214, and 314 according to Embodiments 1 to 3 is typically implemented as an LSI that is an integrated circuit. Each of the processing units may be made into a single-function LSI, or a part or an entire thereof may be made into the LSI.

Furthermore, ways to achieve integration are not limited to the LSI, and a special circuit or a general purpose processor and so forth can also achieve the integration. Field Programmable Gate Array (FPGA) that can be programmed after manufacturing LSI or a reconfigurable processor that allows re-configuration of the connection or configuration of LSI can be used for the same purpose.

Furthermore, a part or an entire of the functions of the memory interface circuits 114, 214, and 314 according to Embodiments 1 to 3 may be implemented by a processor, such as a CPU through executing a program.

Furthermore, the present invention may be implemented by the program or a recording medium on which the program is recorded. Obviously, the program can be distributed via a transmission medium, such as the Internet.

The present invention may be implemented not only as the memory interface circuits 114, 214, and 314 but also as a drive capability adjustment method for a memory device using the characteristic units included in each of the memory interface circuits 114, 214, and 314 as steps.

Furthermore, the present invention may be implemented as a semiconductor integrated circuit device (LSI) that can achieve a part or an entire of the functions of the memory interface circuits 114, 214, and 314.

Furthermore, the present invention may be implemented as the memory system 100 including the memory interface circuit 114 and the memory device 101, the memory system 200 including the memory interface circuit 214 and the memory device 201, and the memory system 300 including the memory interface circuit 314 and the memory device 301.

Furthermore, at least part of functions of the memory interface circuits 114, 214, and 314 according to Embodiments 1 to 3 and the modifications thereof may be combined.

Furthermore, since the numbers used herein are all the exemplifications for specifically describing the present invention, the present invention is not limited to the described numbers. Furthermore, a logic level represented by high or low is merely an exemplification for specifically describing the present invention, and an equivalent result can be obtained by combining logic levels different from the exemplified logic level. Furthermore, since the connection relationships between the constituent elements are exemplifications for specifically describing the present invention, the connection relationships to implement the functions of the present invention are not limited to the described ones.

Furthermore, since the configuration of each of the memory interface circuits 114, 214, and 314 is an exemplification for specifically describing the present invention, each of the memory interface circuits 114, 214, and 314 does not necessarily include all the constituent elements above. In other words, each of the memory interface circuits 114, 214, and 314 according to the present invention has only to include the minimum constituent elements that can achieve the advantageous effects of the present invention.

For example, although each of the memory interface circuits 114, 214, and 314 has both a function of calibrating a delay amount and a function of calibrating a drive capability of a memory device as described above, it may have only one of the functions.

Similarly, since the drive capability adjustment method for a memory device by each of the memory interface circuits 114, 214, and 314 is an exemplification for specifically describing the present invention, the method does not have to include all the steps. In other words, the drive capability adjustment method for a memory device by each of the memory interface circuits 114, 214, and 314 has only to include the minimum steps that can achieve the advantageous effects of the present invention. Furthermore, since the order of executing the steps is an exemplification for specifically describing the present invention, the steps may be performed in a different order. Furthermore, a part of the steps may be executed in parallel with other steps.

Furthermore, the present invention includes various modifications and revisions that are conceivable from Embodiments by a person skilled in the art, without departing from the scope of the present invention.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

Industrial Applicability

The present invention is applicable to a memory interface circuit. Furthermore, the present invention is applicable to, for example, a digital television (DTV), a DVD recorder, a BD recorder, a digital still camera, a digital video camera, and a mobile phone each including the memory interface circuit.

The invention claimed is:

1. A memory interface circuit connected to a memory device that outputs a first data signal and has a variable drive capability for driving the first data signal, said memory interface circuit comprising:
a first delay unit configured to delay a first strobe signal outputted from the memory device by a first delay amount to generate a first delayed strobe signal;
a first data latch unit configured to latch the first data signal as a first latched data signal in synchronization with the first delayed strobe signal;
a second data latch unit configured to latch the first data signal as a second latched data signal;
a first delay control unit configured to sequentially change a value of the first delay amount;
a first range calculating unit configured to calculate a first delay range width that is a width of a range of values of the first delay amount which allow said first data latch unit to correctly latch the first data signal as the first latched data signal; and
a drive capability setting unit configured to adjust the drive capability of the memory device so as to widen the first delay range width.

2. The memory interface circuit according to claim 1, wherein said second data latch unit is configured to output the second latched data signal to the outside of said memory interface circuit.

3. The memory interface circuit according to claim 1, further comprising
a comparison determining unit configured to determine whether or not the first latched data signal matches the second latched data signal, for each value of the first delay amount changed by said first delay control unit,
wherein said first range calculating unit is configured to calculate the width of the range of the values, of the first delay amount, with each of which the first latched data signal matches the second latched data signal, as the first delay range width using a result of the determination by said comparison determining unit.

4. The memory interface circuit according to claim 3, further comprising
a second delay unit configured to delay the first strobe signal by a second delay amount to generate a second delayed strobe signal,
wherein said second data latch unit is configured to latch the first data signal as the second latched data signal in synchronization with the second delayed strobe signal,
said first range calculating unit is configured to calculate a first delay range using the result of the determination by said comparison determining unit, the first delay range being the range of the values, of the first delay amount, with each of which the first latched data signal matches the second latched data signal, and
said memory interface circuit further comprises a second delay control unit configured to set a value of the second delay amount within the first delay range.

5. The memory interface circuit according to claim 4, wherein the memory device further outputs a second data signal, and has a variable drive capability for driving the second data signal,
said memory interface circuit further comprises:
a third delay unit configured to delay the first strobe signal by a third delay amount to generate a third delayed strobe signal; and
a third data latch unit configured to latch the second data signal as a third latched data signal in synchronization with the third delayed strobe signal, and output the third latched data signal to the outside of said memory interface circuit,
said first data latch unit is further configured to latch the second data signal as a fourth latched data signal in synchronization with the first delayed strobe signal,
said comparison determining unit is further configured to determine whether or not the fourth latched data signal matches the third latched data signal, for each of the values of the first delay amount changed by said first delay control unit, said first range calculating unit is further configured to calculate a second delay range within the range of the values of the first delay amount, using the result of the determination by said comparison determining unit, the second delay range being a range of values, of the first delay amount, with each of which the fourth latched data signal matches the third latched data signal, and said memory interface circuit further comprises a second delay control unit configured to set a value of the third delay amount within the second delay range.

6. The memory interface circuit according to claim 5, further comprising:

a first selecting unit configured to select one of the first data signal and the second data signal, and output the selected data signal; and a second selecting unit configured to select (i) the second latched data signal when said first selecting unit selects the first data signal and (ii) the third latched data signal when said first selecting unit selects the second data signal, and output the selected latched data signal, wherein said first data latch unit is configured to latch the selected data signal as one of the first latched data signal and the fourth latched data signal, and said comparison determining unit is configured to determine whether or not the selected latched data signal matches one of the first latched data signal and the fourth latched data signal, for each of the values of the first delay amount changed by said first delay control unit.

7. The memory interface circuit according to claim 1, wherein said drive capability setting unit is configured to:

sequentially change the drive capability of the memory device; and store a plurality of first delay range widths including the first delay range width that are calculated by said first range calculating unit for each drive capability sequentially changed, and adjust the drive capability of the memory device to a drive capability corresponding to a largest first delay range width among the stored first delay range widths.

8. The memory interface circuit according to claim 7, wherein said drive capability setting unit is configured to:

change the drive capability of the memory device in a first direction;

repeat processes for changing the drive capability of the memory device in the first direction, until a difference value obtained by subtracting the first delay range width immediately before changing the drive capability from the first delay range width after changing the drive capability is smaller than a first threshold;

change the drive capability of the memory device in a second direction when the difference value is smaller than the first threshold, the second direction being opposite to the first direction;

repeat the processes for changing the drive capability of the memory device in the second direction, until a difference value obtained by subtracting the first delay range width immediately before changing the drive capability from the first delay range width after changing the drive capability is smaller than a second threshold;

store the first delay range width calculated by said first range calculating unit for each of the changed drive capabilities; and adjust the drive capability of the memory device to the drive capability corresponding to the largest first delay range width among the stored first delay range widths.

9. The memory interface circuit according to claim 1, wherein the memory device further outputs a third data signal and a second strobe signal, and has a variable drive capability for driving the third data signal, said memory interface circuit further comprises:

a fourth delay unit configured to delay the second strobe signal by a fourth delay amount to generate a fourth delayed strobe signal;

a fourth data latch unit configured to latch the third data signal as a fifth latched data signal in synchronization with the fourth delayed strobe signal;

a fifth data latch unit configured to latch the third data signal as a sixth latched data signal, and output the sixth latched data signal to the outside of said memory interface circuit;

a fourth delay control unit configured to sequentially change a value of the fourth delay amount;

a second range calculating unit configured to calculate a second delay range width that is a width of a range of values of the fourth delay amount which allow said fourth data latch unit to correctly latch the second data signal as the fifth latched data signal; and a range computing unit configured to generate a third delay range width that is an intermediate value between a value of the first delay range width and a value of the second delay range width, and said drive capability setting unit is configured to adjust the drive capability of the memory device so as to widen the third delay range width.

10. The memory interface circuit according to claim 1, wherein said first data latch unit is configured to latch the first data signal as the first latched data signal at both rising and falling edges of the first delayed strobe signal.

11. A drive capability adjustment method for adjusting a drive capability of a memory device that outputs a first data signal and has a variable drive capability for driving the first data signal, said method comprising:

delaying a first strobe signal outputted from the memory device by a first delay amount to generate a first delayed strobe signal;

latching the first data signal as a first latched data signal in synchronization with the first delayed strobe signal;

latching the first data signal as a second latched data signal;

sequentially changing a value of the first delay amount;

calculating a first delay range width that is a width of a range of values of the first delay amount with each of which the first data signal can be correctly latched as the first latched data signal in said latching of the first data signal; and adjusting the drive capability of the memory device so as to widen the first delay range width.

* * * * *